US010062789B2

(12) United States Patent
Yang et al.

(10) Patent No.: US 10,062,789 B2
(45) Date of Patent: Aug. 28, 2018

(54) THIN FILM TRANSISTOR AND OPERATING METHOD THEREOF

(71) Applicant: AU Optronics Corporation, Hsin-Chu (TW)

(72) Inventors: Yu-Xin Yang, Hsin-Chu (TW);
Kuo-Kuang Chen, Hsin-Chu (TW);
Tsung-Hsiang Shih, Hsin-Chu (TW);
Ming-Yen Tsai, Hsin-Chu (TW);
Ting-Chang Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/346,798

(22) Filed: Nov. 9, 2016

(65) Prior Publication Data
US 2017/0133514 A1    May 11, 2017

(30) Foreign Application Priority Data

Nov. 11, 2015   (TW) .............................. 104137111 A

(51) Int. Cl.
H03K 17/68      (2006.01)
H01L 29/786     (2006.01)
H03K 17/687     (2006.01)

(52) U.S. Cl.
CPC .. *H01L 29/78648* (2013.01); *H01L 29/78696* (2013.01); *H03K 17/687* (2013.01); *H03K 2017/6878* (2013.01)

(58) Field of Classification Search
CPC ........... H01L 29/78648; H01L 29/7869; H01L 29/0649; H01L 29/08645; H03K 17/04106; H03K 17/161; H03K 17/687; H03K 19/00315; H03K 19/096; H03K 17/6878
USPC ........................ 327/534, 535; 257/43, 57, 71
See application file for complete search history.

(56) References Cited

U.S. PATENT DOCUMENTS 8,988,152 B2 *  3/2015  Ohmaru .............. H01L 27/1225
                                                  326/119

FOREIGN PATENT DOCUMENTS

CN    201910060 U    7/2011
CN    104183664 A   12/2014
JP     01094670      4/1989
JP    2002259955 A   9/2002

* cited by examiner

*Primary Examiner* — John Poos
(74) *Attorney, Agent, or Firm* — McClure, Qualey & Rodack, LLP

(57) ABSTRACT

A thin film includes a substrate, a bottom gate, a channel layer, a source and a drain, and a top gate. The bottom gate is disposed on the substrate. The channel layer is disposed on the bottom gate. The source and the drain are disposed on two different sides of the channel layer. The top gate is disposed on the channel layer, wherein the channel layer is disposed between the bottom gate and the top gate, and the bottom gate and the top gate are electrically isolated from each other. A related method is also provided.

14 Claims, 3 Drawing Sheets

THIN FILM TRANSISTOR AND OPERATING METHOD THEREOF

CROSS-REFERENCE TO RELATED APPLICATION

This application claims priority to Taiwan application number 104137111, filed Nov. 11, 2015, the contents of which are incorporated hereby by reference.

TECHNICAL FIELD

The present disclosure relates to an active device and an operation method thereof, and more particularly to a thin film transistor and an operating method thereof.

BACKGROUND

A flat panel display mainly includes an array substrate having a plurality of switching elements and an opposing substrate. Generally, the switching elements include a gate, a channel layer, and a source, and a drain electrically coupled to the channel layer. The switching elements may be amorphous silicon (α-Si) TFTs, low temperature poly-silicon TFTs, organic TFTs, or oxide semiconductor TFTs, as well as other elements.

In operation, a thin film transistor is susceptible to the influence of backlight, ambient blue light, or UV light which result in a shift in a threshold voltage (Vth), thereby affecting electrical characteristics and the stability of the thin film transistor.

SUMMARY

The present disclosure is directed to a thin film transistor, comprising a bottom gate and a top gate receiving different voltage potentials respectively.

The present disclosure is also directed to a thin film transistor, comprising a bottom gate and a top gate electrically isolated from each other.

The present disclosure is additionally directed to an operation method of a thin film transistor, comprising simultaneously providing a bottom gate and a top gate with different voltages to turn off or turn on the thin film transistor.

The thin film transistor of the present application comprises a substrate, a bottom gate, a channel layer, a source and a drain, and a top gate. The bottom gate is disposed on the substrate. The channel layer is located on the bottom gate. The source and the drain are located on two different sides of the channel layer. The top gate is located on the channel layer and the source and the drain, wherein the bottom gate is configured to receive a first voltage potential, the top gate is configured to receive a second voltage potential, and the second voltage potential is less than the first voltage potential, to turn off the thin film transistor.

The thin film transistor of the present disclosure comprises a substrate, a bottom gate, a channel layer, a source and a drain, and a top gate. The bottom gate is disposed on the substrate. The channel layer is located on the bottom gate. The source and the drain are located on two different sides of the channel layer. The top gate is located on the channel layer and the source and the drain, wherein the channel layer is located between the bottom gate and the top gate, and the bottom gate and the top gate are electrically isolated from each other.

In certain embodiments, the bottom gate and the top gate are connected to different scan lines respectively.

In certain embodiments, the bottom gate is configured to receive a ground voltage, while the top gate is configured to receive a voltage less than the ground voltage to turn off the thin film transistor.

In certain embodiments, the top gate is configured to receive a ground voltage, while the bottom gate is configured to receive a voltage greater than the ground voltage to turn on the thin film transistor.

In certain embodiments, an overlapping width of a region of the top gate overlapping with the channel layer in a projection direction is at least greater than 1 μm.

An operating method of a thin film transistor of the present disclosure comprises the steps of: receiving a ground voltage by the bottom gate, while receiving a voltage less than the ground voltage by the top gate to turn off the thin film transistor.

In certain embodiments, the method further comprises: receiving a ground voltage by the top gate, while receiving a voltage greater than the ground voltage by the bottom gate to turn on the thin film transistor.

In certain embodiments, a voltage difference between the bottom gate and the top gate is at least equal to or greater than a threshold voltage of the transistor to turn off the thin film transistor.

In certain embodiments, a voltage difference between the bottom gate and the top gate is at least equal to or greater than a threshold voltage of the transistor to turn on the thin film transistor.

Based on the foregoing, the thin film transistor described in embodiments of the present disclosure has the bottom gate and the top gate electrically isolated from each other or the bottom gate and the top gate receiving different voltage potential.

To make the above characteristics and advantages of the present disclosure clearer and more readily understand, the following embodiments are described in detail in conjunction with accompanying figures.

BRIEF DESCRIPTIONS OF THE DRAWINGS

DETAILED DESCRIPTION

Figure 1:
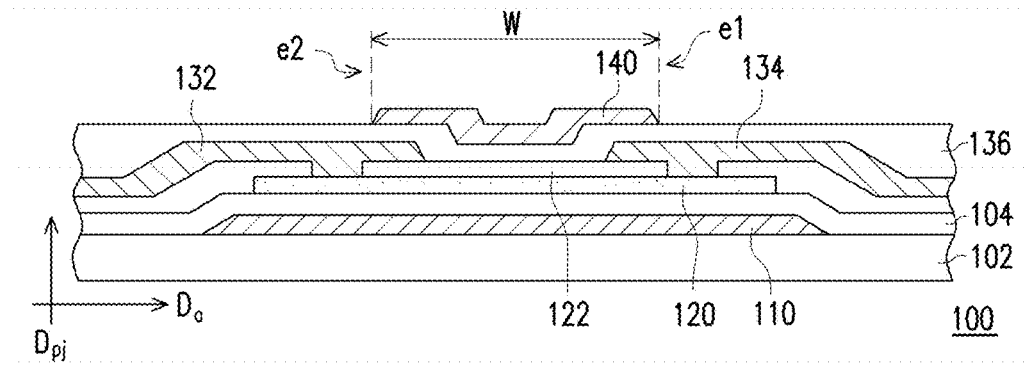
FIG. 1 is a schematic view of a thin film transistor according to one embodiment of the present disclosure.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that often same thing can be said in more than one way. Consequently, alternative language and synonyms may be used for many one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

It will be understood that when an element is referred to as being (electrically) coupled to another element, it can be directly (electrically) coupled to the other element or intervening elements may be present. In contrast, when an element is referred to as being directly (electrically) coupled to another element, there are no intervening elements present. As used herein, the term "and/or" includes any and all combinations of one or more of the associated listed items.

It will be also understood that in the description herein of signal transmission or provision, transmitted signals actually may be subjected to attenuation or distortion, but still have correspondence with signals before transmission, such that predefined signals can be transmitted in engineering. Thus, the correspondence of two signals at a signal transmitting end and a signal receiving end should not be excluded due to attenuation or distortion generated in the transmission.

It will be understood that when an element is referred to as being located "on," "above" or "over" another element, it can be directly located on the other element or intervening elements may also be present. In contrast, when an element is referred to as being located directly on another element, there are no intervening elements present. Accordingly, the designations of other relative positions, for example, "above" or "over" also may have respective understandings.

It will be understood that, although the terms first, second, third etc. may be used herein to describe various elements, components, regions, layers and/or sections, these elements, components, regions, layers and/or sections should not be limited by these terms. These terms are only configured to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Further, relative terms, such as "lower" or "bottom", "upper" or "top", and "left" or "right" may be used herein to describe one element's relationship to another elements as illustrated in the Figures. It will be understood that the relative terms are intended to encompass different orientations of the elements in addition to the orientation depicted in the Figures. For example, if the elements were inverted with respect to the view in the Figures, another element described as located "below" an element, for example, would now be located above this element. Thus, the exemplary term "below" can encompass both an orientation of above and below. Similarly, if the elements were inverted with respect to the view in the Figures, an element described as located "beneath" or "under" another element, for example, would now be located "over" the other element. Thus, the exemplary term "beneath" or "under" can encompass both an orientation of over and under.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the term "substantially", "essentially", or "basically" reflects limitations in the manufacturing process, or situations where the disclosure still effectively operates with significant variations. And, it will be appreciated that when those skilled in the art implement embodiments in the disclosure from the teachings of the disclosure, the implementations may be slightly different from the embodiments in the disclosure due to limitations in the manufacturing process, but one skilled in the art will recognize that the implementations are "substantially" or "essentially" the same as the embodiments in the disclosure.

FIG. 1 is a schematic view of a thin film transistor according to one embodiment of the present disclosure. A thin film transistor 100 comprises a substrate 102, a bottom gate 110, a channel layer 120, a source 132 and a drain 134, and a top gate 140. The substrate 102 may be formed from various materials, including, for example, glass, quartz, organic polymers, opaque materials, or other suitable materials, wherein the opaque materials may be conductive materials, wafers, ceramics, or other suitable materials.

The bottom gate 110 is disposed on the substrate 102. In the present embodiment, a material of the bottom gate 110 includes, for example, metal materials, other conductive materials, or stacked layers of metal materials and other conductive materials. The metal materials may be aluminum, copper, molybdenum, or titanium, and other conductive materials may be alloy, metal nitrides, metal oxides, metal oxynitrides. In the present embodiment, the thin film transistor 100 further comprises a gate insulating layer 104, disposed between the substrate 102 and the bottom gate 110. In the present embodiment, the gate insulating layer 104 blanket-covers the substrate 102 and the bottom gate 110, for example. In the present embodiment, a material of the gate insulating layer 104 is, for example, silicon oxide, silicon nitride, silicon oxynitride, or another dielectric material.

The channel layer 120 is located above the bottom gate 110. In the present embodiment, a material of the channel layer 120 is, for example, metal oxide semiconductor, amorphous silicon, polycrystalline silicon, low temperature polysilicon, epitaxial silicon, organic semiconductor, another suitable semiconductor material, or a stacked layer of at least two of the above-mentioned materials. The metal oxide semiconductor may be indium tin oxide (ITO), indium zinc oxide (IZO), aluminum tin oxide (ATO), aluminum zinc oxide (AZO), indium gallium oxide (IGO), indium germanium zinc oxide (IGZO).

The source 132 and the drain 134 are located on two different sides of the channel layer 120. In the present embodiment, the source 132 and the drain 134 are, for example, located on two opposing sides of the channel layer 120 above the bottom gate 110, and in certain embodiments the source 132 and the drain 134 are electrically coupled to the channel layer 120. In the present embodiment, materials of the source 132 and the drain 134 include, for example, metal materials, other conductive materials, or stacked layers of metal materials and other conductive materials. The metal materials may be aluminum, copper, molybdenum, or titanium, and other conductive materials may be alloy, metal nitrides, metal oxides, metal oxynitrides, or other suitable materials. In the present embodiment, the thin film transistor 100 further comprises an etch stop layer 122, disposed between the channel layer 120 and the source 132 and the drain 134. A material of the etch stop layer 122 is, for example, an organic material, an inorganic material, or a mixture thereof.

The top gate 140 is located on the channel layer 120 and the source 132 and the drain 134, wherein the channel layer 120 is located between the bottom gate 110 and the top gate 140. In the present embodiment, the bottom gate 110 and the top gate 140 are, for example, electrically isolated from each other. In the present embodiment, the bottom gate 110 is, for example, used to receive a first voltage potential, the top gate 140 is, for example, used to receive a second voltage potential, and the second voltage potential is less than the first voltage potential to turn off the thin film transistor 100, which will be described in detail below. In the present embodiment, a material of the top gate 140 includes, for example, metal materials, other conductive materials, or stacked layers of metal materials and other conductive materials. The metal materials may be aluminum, copper, molybdenum, or titanium, and other conductive materials may be alloy, metal nitrides, metal oxides, metal oxynitrides, or other suitable materials. In the present embodiment, the thin film transistor 100 further comprises a protective layer 136, disposed between the top gate 140 and the source 132, and between the top gate 140 the drain 134. In the present embodiment, the protective layer 136 blanket-covers the substrate 102, the bottom gate 110, the channel layer 120, and the source 132 and the drain 134, for example. In the present embodiment, a material of the protective layer 136 is, for example, silicon oxide, silicon nitride, silicon oxynitride, or another dielectric material.

In the present embodiment, the thin film transistor 100 comprises, for example, the bottom gate 110, the channel layer 120, the source 132 and the drain 134, and the top gate 140, stacked on the substrate 102 in order. In the present embodiment, the top gate 140 and the channel layer 120 have an overlapping region (i.e., the region between two dashed lines denoted by e1 and e2 in FIG. 1) in a projection direction $D_{pj}$, and the overlapping region has an overlapping width W of at least 1 μm. The overlapping width W is, for example, a distance from a first edge e1 to a second edge e2 of the region of the top gate 140 overlapping with the channel layer 120 in a direction $D_a$ perpendicular to the projection direction $D_{pj}$, wherein the first edge e1 and the second edge e2 are located at two opposite sides. In the present embodiment, the projection direction $D_{pj}$ is, for example, a direction along which the top gate 140 stacks with the channel layer 120, such as the z direction, and the direction $D_a$ is, for example, the x direction. In another embodiment, when the projection direction $D_{pj}$ is, for example, the z direction, the direction $D_a$ also may be the y direction. Each two of the x, y, and z directions may be perpendicular to each other. Herein, the overlapping width W may be a full width or a partial width of the top gate 140, namely, the top gate 140 and the channel layer 120 may be substantially overlapped (as shown in FIG. 1), or the top gate 140 and the channel layer 120 are at least partially overlapped. The overlapping width W generally refers to a vertical width in a short-side direction of the top gate 140. The top gate 140 may be entirely located above a central portion of the channel layer 120 or located above one side of the channel layer 120. Alternatively, the top gate 140 also may have one portion that is not overlapped with the channel layer 120 to be beyond one edge of the channel layer 120; namely, the top gate 140 at least has an overlapping portion with the channel layer 120.

Figure 2:
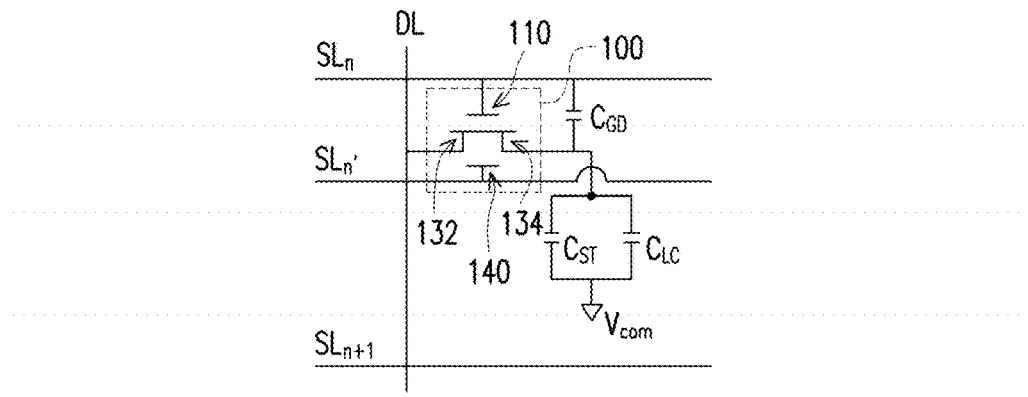
FIG. 2 is a schematic view of an equivalent circuit of the thin film transistor in FIG. 1 when being applied in a display.

FIG. 2 is a schematic view of an equivalent circuit of the thin film transistor in FIG. 1, as applied in a display. Referring to FIG. 2, in the present embodiment, the bottom gate 110 and the top gate 140 are for example, electrically coupled to different scan lines $SL_n$, $SL_{n'}$ respectively, wherein the bottom gate 110 is, for example, electrically coupled to the scan line $SL_n$, and the top gate 140 is, for example, electrically coupled to the scan line $SL_{n'}$. The source 132 and the drain 134 are, for example, electrically coupled to a data line DL. That is, the thin film transistor 100 is a four-terminal, dual-gate device. The bottom gate 110 and the top gate 140 are electrically isolated from each other, so that the bottom gate 110 and the top gate 140 form independent operating terminals respectively. $C_{GD}$ is a gate/drain capacitance, $C_{ST}$ is a storage voltage, $C_{LC}$ is a liquid crystal capacitance, and $V_{com}$ is a common voltage potential.

Figure 3:
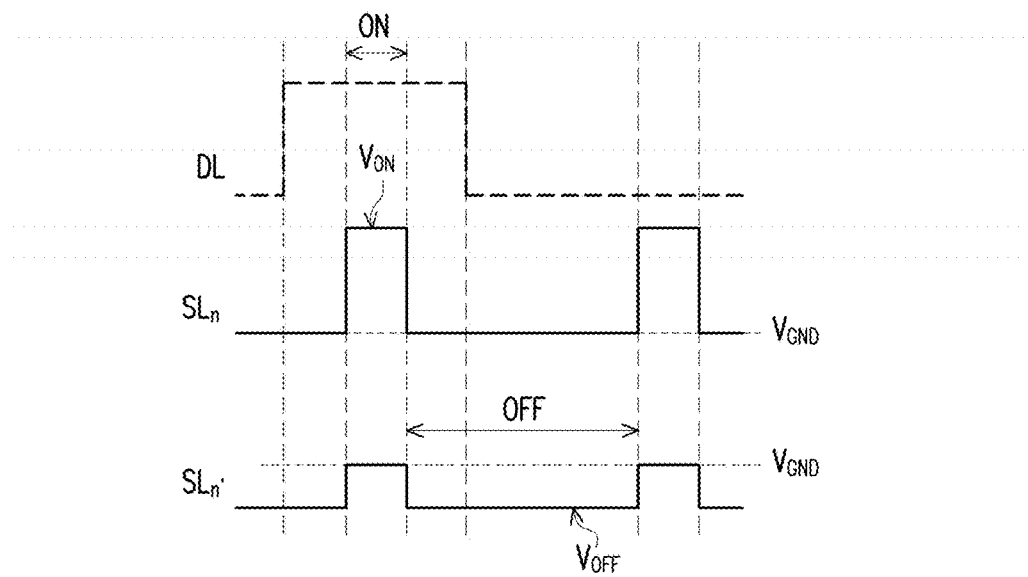
FIG. 3 is a schematic view of a timing signal of a scan line electrically coupled to a bottom gate and a scan line electrically coupled to a top gate for the thin film transistor in FIG. 1 when being driven.

Please refer to FIG. 3, which is a timing diagram of signals of the scan line electrically coupled to the bottom gate 110 and the scan line electrically coupled to the top gate 140 for the thin film transistor in FIG. 1 when being driven. In the present embodiment, when the data line DL provides a data signal and also provides a drive signal respectively for the scan line $SL_n$ and the scan line $SL_{n'}$, the top gate 140 is configured to receive a ground voltage $V_{GND}$, while the bottom gate 110 is configured to receive a voltage $V_{ON}$ greater than the ground voltage $V_{GND}$ to turn on (conduct) the thin film transistor 100. That is, in a turning-on (ON) operation, the top gate 140 is, for example, grounded, and also, for example, the bottom gate 110 is provided with a positive voltage potential. Then, the bottom gate 110 is configured to receive a ground voltage $V_{GND}$, while the top gate 140 is configured to receive a voltage $V_{OFF}$ less than the ground voltage $V_{GND}$ (i.e., a negative voltage potential) to turn off the thin film transistor 100. In other words, when the thin film transistor 100 is turned off, the voltage potential received by the bottom gate 110 is greater than the voltage potential received by the top gate 140. That is, in a turning-off (OFF) operation, the bottom gate 110 is, for example, grounded, and also, for example, the top gate is provided with a negative voltage potential. Therefore, the bottom gate 110 dominates the turning-on of the thin film transistor 100 and the top gate 140 dominates the turning-off of the thin film transistor 100. In the present embodiment, a voltage difference between the bottom gate 110 and the top gate 140 is at least equal to or greater than a threshold voltage Vth of the transistor, for example at least equal to or greater than 15 V, to turn on the thin film transistor 100. In the present embodiment, a voltage difference between the bottom gate 110 and the top gate 140 is, for example, at least equal to or greater than a threshold voltage Vth of the transistor, such as at least equal to or greater than 10 V, to turn off the thin film transistor 100. In the present embodiment, the ground voltage $V_{GND}$ is, for example, 0 V, the voltage $V_{ON}$ is, for example, 15 V, and the voltage $V_{OFF}$ is, for example, −10 V.

Figure 4:
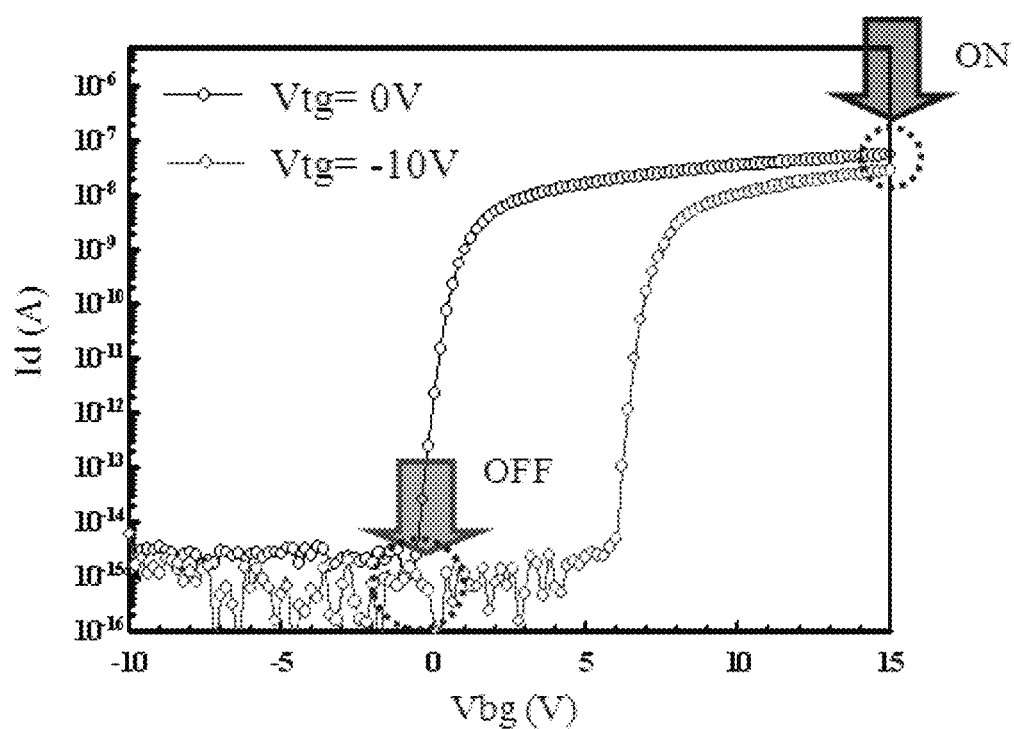
FIG. 4 is a graph of a drain current versus a bottom gate voltage (Id-Vbg) of the thin film transistor in FIG. 1 of the present disclosure.

FIG. 4 is a graph showing a drain current versus a bottom gate voltage (Id-Vbg) of the thin film transistor in FIG. 1 of the present disclosure. In FIG. 4, a top gate voltage (Vtg) of the left curve is 0 V, and a top gate voltage (Vtg) of the right curve is −10 V. It is known from FIG. 4 that, when the top gate voltage (Vtg) is 0 V and the bottom gate voltage (Vbg) is 15 V, the thin film transistor may be turned on (e.g. the ON portion as shown); when the bottom gate voltage (Vbg) is 0 V and the top gate voltage (Vtg) is −10 V, the thin film transistor may be turned off (e.g. the OFF portion as shown). As may be seen, the turning-on (ON) of the thin film transistor of the present disclosure is operated by the bottom gate, and the turning-off (OFF) of the thin film transistor is operated by the top gate. In a turning-on (ON) operation, the top gate 140 is, for example, grounded, and also, for example, provides the bottom gate 110 with a positive bias. In a turning-off (OFF) operation, the bottom gate 110 is, for example, grounded, and also, for example, provides the top gate 140 with a negative bias.

Figure 5A:
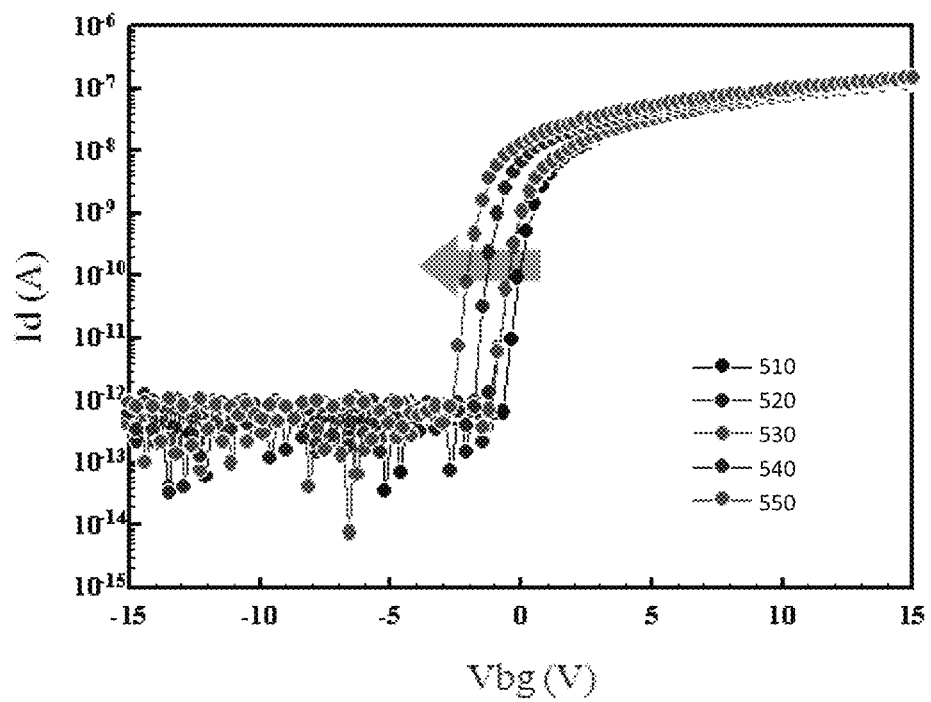
FIG. 5A is a graph of a drain current versus a bottom gate voltage (Id-Vbg) of a conventional thin film transistor.
Figure 5B:
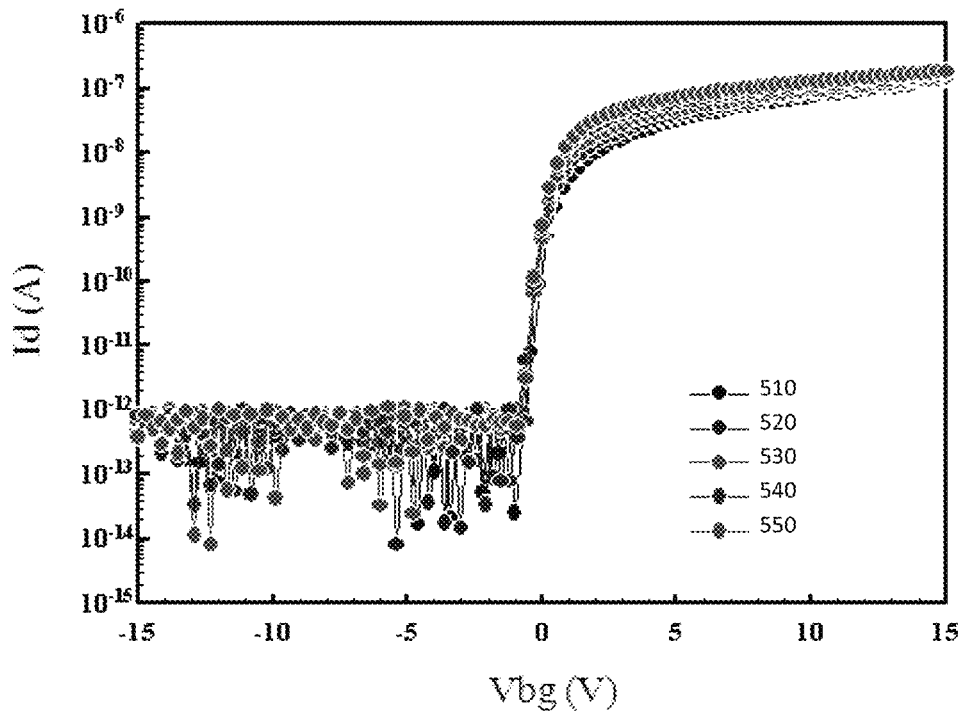
FIG. 5B is a graph of a drain current versus a bottom gate voltage (Id-Vbg) of the thin film transistor in FIG. 1 of the present disclosure.

FIG. 5A is a graph showing a drain current versus a bottom gate voltage (Id-Vbg) of a conventional thin film transistor in a negative bias illumination stress (NBIS) test, and FIG. 5B is a graph of a drain current versus a bottom gate voltage (Id-Vbg) of the thin film transistor in FIG. 1 of the present disclosure in the NBIS test. In the figures, curve 510 represents an initial curve, and curve 520 to curve 550 represent curves in which the pressure is applied for 100, 200, 500, and 1000 second. The conventional thin film transistor also comprises a bottom gate and a top gate, which are different from the thin film transistor of the present disclosure in that the bottom gate and the top gate of the conventional thin film transistor are electrically coupled to each other, so that both ON and OFF of the thin film transistor are dominated by the bottom gate, while the bottom gate and the top gate of the thin film transistor of the present disclosure are electrically isolated from each other, so that ON and OFF of the thin film transistor are dominated by the bottom gate and the top gate, respectively. In the present experimental example, the NBIS test is to apply a negative bias on the thin film transistors and excite backlight emission for subsequent measurements. It will be understood from FIG. 5A that, after the bottom gate is given with a negative bias for a long time and illuminated, for a drain of the conventional thin film transistor, the uniformity of a drain current (Id) has a serious shift (as indicated by an arrow) and is not stable. This is because that the turning-off of the conventional thin film transistor is operated by the bottom gate, which tends to cause electric holes to be trapped in a gate insulating layer and at the interface of the gate insulating layer and a channel layer, such that a phenomenon of negative shift occurs in a threshold voltage of the thin film transistor, resulting in degeneration of the device.

It can be understood from FIG. 5B, the drain of the thin film transistor of the present disclosure has stable and better current uniformity, when being driven by the bottom gate voltage. One reason for this is that the turning-off of the thin film transistor of the present disclosure is operated independently by the top gate, so that even if holes are trapped in the etch stop layer and at the interface of the etch stop layer and the channel layer during the OFF period, as long as the top gate is given with a negative voltage potential, the channel may be turned off to block the current, thus not affecting the operation of the bottom gate to turn on the thin film transistor. Therefore, the phenomenon of the threshold voltage shift of the thin film transistor is mitigated.

In sum, the thin film transistor of the present disclosure has the bottom gate and the top gate electrically isolated from each other, wherein the bottom gate dominates the turning-on of the thin film transistor and the top gate dominates the turning-off of the thin film transistor. For example, a ground voltage is received by the bottom gate, while a voltage less than the ground voltage is received by the top gate (i.e., a negative voltage potential) to turn off the thin film transistor. A ground voltage is received by the top gate, while a voltage greater than the ground voltage is received by the bottom gate (i.e. a positive bias) to turn on the thin film transistor. That is, the bottom gate and the top gate turn on and turn off the thin film transistor independently, so that even if electric holes are trapped in the etch stop layer and at the interface of the etch stop layer and the channel layer, the OFF operation of the thin film transistor is relatively less affected. As such, the shift phenomenon of the threshold voltage of the thin film transistor due to negative bias illumination can be improved, such that the thin film transistor has better electrical characteristics and stability.

Even though the present disclosure has been disclosed as the abovementioned embodiments, it is not limited thereto. Persons skilled in the art will appreciate that changes and adjustments can be made without departing from the spirit and scope of the present disclosure. The scope of the present disclosure is defined in view of the appended claims.

What is claimed is:

1. A thin film transistor, comprising:
   a substrate;
   a bottom gate, disposed above the substrate;
   a channel layer, disposed above the bottom gate;
   a source and a drain, electrically coupled to the channel layer; and
   a top gate, located above the channel layer, wherein the bottom gate is configured to receive a first voltage potential, the top gate is configured to receive a second voltage potential, and the second voltage potential is less than the first voltage potential, to turn off the thin film transistor,
   wherein the top gate is configured to receive a ground voltage, while the bottom gate is configured to receive a voltage greater than the ground voltage, to turn on the thin film transistor.

2. A thin film transistor, comprising:
   a substrate;
   a bottom gate, disposed above the substrate;
   a channel layer, located above the bottom gate;
   a source and a drain, electrically coupled to the channel layer; and
   a top gate, located above the channel layer, wherein the channel layer is located between the bottom gate and the top gate, and the bottom gate and the top gate are electrically isolated from each other,
   wherein the bottom gate is configured to receive a ground voltage, while the top gate is configured to receive a voltage less than the ground voltage, to turn off the thin film transistor.

3. The thin film transistor of claim 2, wherein the bottom gate and the top gate are connected to different scan lines respectively.

4. The thin film transistor of claim 2, wherein the top gate is configured to receive the ground voltage, while the bottom gate is configured to receive a voltage greater than the ground voltage, to turn on the thin film transistor.

5. A thin film transistor, comprising:
a substrate;
a bottom gate, disposed above the substrate;
a channel layer, located above the bottom gate;
a source and a drain, electrically coupled to the channel layer; and
a top gate, located above the channel layer, wherein the channel layer is located between the bottom gate and the top gate, and the bottom gate and the top gate are electrically isolated from each other, wherein the top gate is configured to receive a ground voltage, while the bottom gate is configured to receive a voltage greater than the ground voltage, to turn on the thin film transistor.

6. The thin film transistor of claim 5, wherein a width of a region of the top gate overlapping with the channel layer in a projection direction is greater than 1 μm.

7. The thin film transistor of claim 2, wherein a width of a region of the top gate overlapping with the channel layer in a projection direction is at least greater than 1 μm.

8. An operating method of a thin film transistor having a substrate, a bottom gate disposed above the substrate, a channel layer located above the bottom gate, a source and a drain electrically coupled to the channel layer, a top gate, located above the channel layer, wherein the channel layer is located between the bottom gate and the top gate, and the bottom gate and the top gate are electrically isolated from each other, the operating method comprising:
receiving a ground voltage by the bottom gate;
simultaneously receiving a voltage less than the ground voltage by the top gate; and
turning off the thin film transistor in response to the simultaneously-received voltages.

9. The operating method of claim 8, wherein a voltage difference between the bottom gate and the top gate is at least equal to or greater than a threshold voltage of the transistor to turn off the thin film transistor.

10. The operating method of claim 8, wherein a voltage difference between the bottom gate and the top gate is at least equal to or greater than a threshold voltage of the transistor to turn on the thin film transistor.

11. The operating method of claim 8, further comprising receiving the ground voltage by the top gate, while receiving a voltage greater than the ground voltage by the bottom gate, to turn on the thin film transistor.

12. The operating method of claim 11, wherein a voltage difference between the bottom gate and the top gate is at least equal to or greater than a threshold voltage of the transistor to turn off the thin film transistor.

13. The operating method of claim 11, wherein a voltage difference between the bottom gate and the top gate is at least equal to or greater than a threshold voltage of the transistor to turn on the thin film transistor.

14. The thin film transistor of claim 5, wherein the bottom gate and the top gate are connected to different scan lines respectively.

* * * * *